United States Patent
Kawakita et al.

(10) Patent No.: US 7,528,469 B2
(45) Date of Patent: May 5, 2009

(54) SEMICONDUCTOR EQUIPMENT HAVING MULTIPLE SEMICONDUCTOR DEVICES AND MULTIPLE LEAD FRAMES

(75) Inventors: Haruo Kawakita, Okazaki (JP); Koji Ando, Kariya (JP)

(73) Assignee: Denso Corporation, Kariya, Aichi-Pref. (JP)

( * ) Notice: Subject to any disclaimer, the term of this patent is extended or adjusted under 35 U.S.C. 154(b) by 359 days.

(21) Appl. No.: 11/142,346

(22) Filed: Jun. 2, 2005

(65) Prior Publication Data

US 2005/0269674 A1    Dec. 8, 2005

(30) Foreign Application Priority Data

Jun. 3, 2004   (JP) .............................. 2004-165946
Apr. 8, 2005   (JP) .............................. 2005-112512

(51) Int. Cl.
*H01L 23/495*   (2006.01)

(52) U.S. Cl. ....................... 257/666; 257/676; 257/672; 257/684; 257/687; 257/675; 257/713; 257/678; 257/E23.044; 257/E23.052; 257/E23.08

(58) Field of Classification Search ................. 257/666, 257/678, 676, 672, 684, 687, 675, 713, E23.044, 257/E23.052, E23.08
See application file for complete search history.

(56) References Cited

U.S. PATENT DOCUMENTS 5,948,991 A * 9/1999 Nomura et al. ................ 73/727
6,891,739 B2 * 5/2005 Nadd et al. .................. 363/147

FOREIGN PATENT DOCUMENTS

JP    2004-104153    12/2003

* cited by examiner

*Primary Examiner*—Lynne Gurley
*Assistant Examiner*—Junghwa Im
(74) *Attorney, Agent, or Firm*—Nixon & Vanderhye PC

(57) ABSTRACT

Semiconductor equipment includes: a first lead frame having a first semiconductor device; a second lead frame having a second semiconductor device; a thermal resistor for preventing heat transfer from the first lead frame to the second lead frame; and a temperature sensitive device for detecting operational temperature of the first semiconductor device. The first lead frame is separated from the second lead frame by a predetermined distance. The thermal resistor is disposed in a clearance between the first lead frame and the second lead frame. The second semiconductor device controls to restrict operation of the first semiconductor device when the operational temperature of the first semiconductor device is higher than a predetermined temperature.

5 Claims, 7 Drawing Sheets

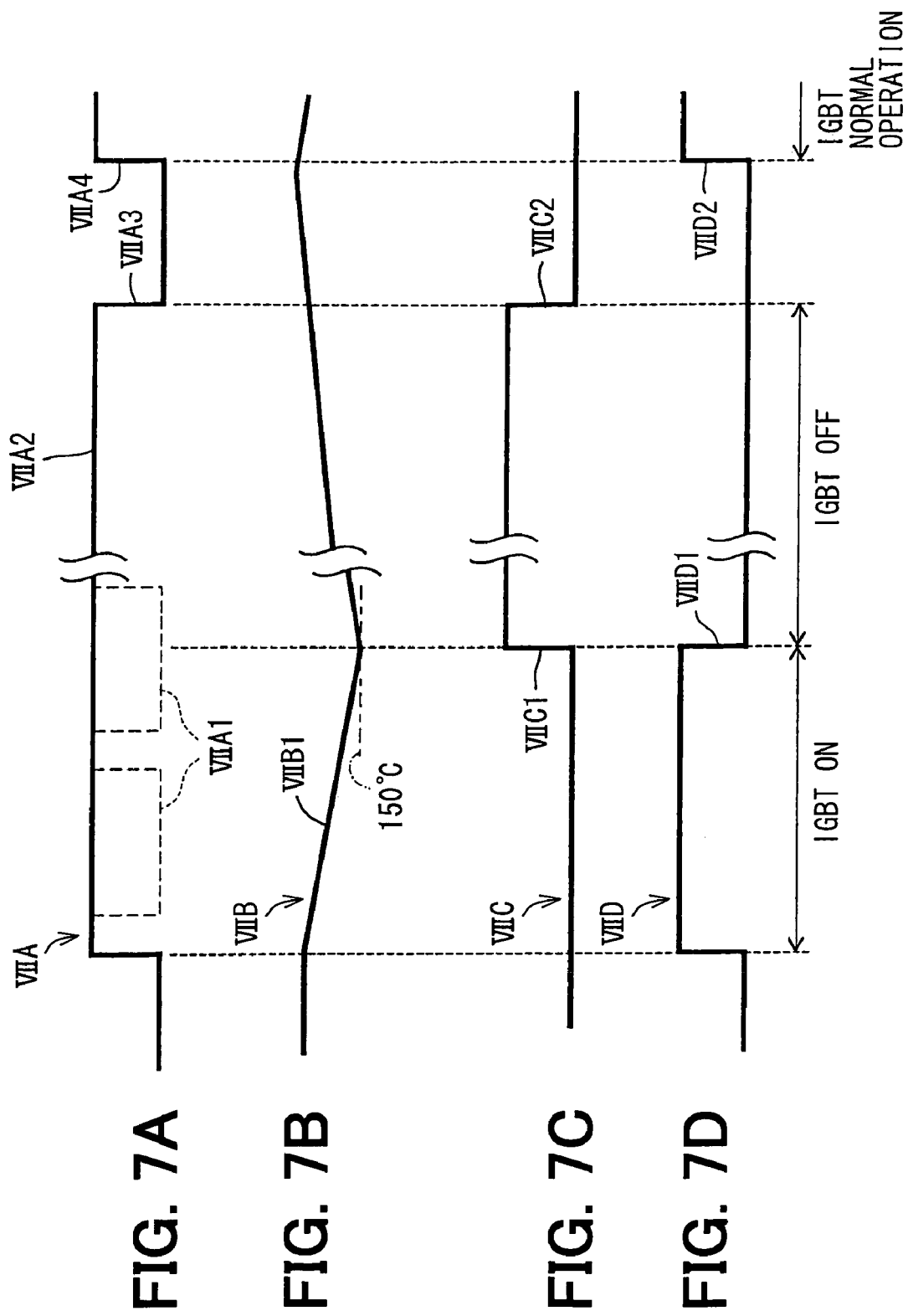

SEMICONDUCTOR EQUIPMENT HAVING MULTIPLE SEMICONDUCTOR DEVICES AND MULTIPLE LEAD FRAMES

CROSS REFERENCE TO RELATED APPLICATIONS

This application is based on Japanese Patent Applications No. 2004-165946 filed on Jun. 3, 2004, and No. 2005-112512 filed on Apr. 8, 2005, the disclosures of which are incorporated herein by references.

FIELD OF THE INVENTION

The present invention relates to semiconductor equipment having multiple semiconductor devices and multiple lead frames.

BACKGROUND OF THE INVENTION

Some kind of semiconductor equipment has a power device and a control device disposed on a lead frame. The control device controls the power device. The power device, the control device and the lead frame are molded with resin. Here, the temperature of the power device is easily increased when the power device is operated. Therefore, it is preferred that the equipment includes heat radiation means for preventing operation failure when the temperature of the power device is increased. This type of equipment is disclosed in, for example, Japanese Patent Application Publication No. 2004-104153.

As shown in FIG. 10, the semiconductor equipment includes multiple IC chips 122, 124, which are mounted on a lead frame 120 through die pads 123, 125, respectively. Specifically, multiple IC chips 122, 124 are mounted on only one lead frame, so that the number of parts in the equipment is reduced. Further, it is no need for positioning multiple lead frames.

However, heat generated one chip is transmitted to the other chip through the lead frame. For example, the temperature of the IC chip 122 becomes comparatively higher when the chip 122 is operated. The temperature of the other chip 124 is comparatively low. In this case, the heat generated in the chip 122 transmits to the other chip 124 through the lead frame 120. Therefore, the temperature of the chip 124 becomes almost equal to that of the chip 122. Thus, in view of compensating temperature increase of the chip 124, it is required to increase accuracy of temperature control of the chip 124. This causes to increase manufacturing cost of the equipment. Further, the temperature increase of the chip 124 is not desirable.

SUMMARY OF THE INVENTION

In view of the above-described problem, it is an object of the present invention to provide semiconductor equipment having multiple semiconductor devices and multiple lead frames.

Semiconductor equipment includes: a first lead frame having a first semiconductor device, which has a high operational temperature; a second lead frame having a second semiconductor device, which has a low operational temperature lower than the operational temperature of the first semiconductor device; a thermal resistor for preventing heat transfer from the first lead frame to the second lead frame; and a temperature sensitive device for detecting the operational temperature of the first semiconductor device and for outputting a temperature signal to the second semiconductor device. The first lead frame is separated from the second lead frame by a predetermined distance. The thermal resistor is disposed in a clearance between the first lead frame and the second lead frame. The second semiconductor device controls to restrict operation of the first semiconductor device in a case where the operational temperature of the first semiconductor device is higher than a predetermined temperature.

In the above equipment, the temperature of the first semiconductor device is prevented from transmitting to the second device. Thus, the temperature of the second device is not increased. Accordingly, the equipment has high accuracy without operational failure.

Preferably, the first lead frame with the first semiconductor device and the second lead frame with the second semiconductor device are molded with a resin mold, which has thermal conductivity lower than that of the first or the second lead frame, and the thermal resistor is provided by a part of the resin mold, which is filled in the clearance between the first and the second lead frames. More preferably, the resin mold includes a lower cover, an upper cover and a resin filling portion. The lower cover covers a lower side of the first and the second lead frames. The upper cover covers an upper side of the first and the second semiconductor devices. The resin filling portion provides the thermal resistor.

BRIEF DESCRIPTION OF THE DRAWINGS

The above and other objects, features and advantages of the present invention will become more apparent from the following detailed description made with reference to the accompanying drawings. In the drawings:

FIGS. 7A to 7D are graphs explaining operation of the equipment according to the first embodiment;

DETAILED DESCRIPTION OF THE PREFERRED EMBODIMENTS

First Embodiment

Figure 1:
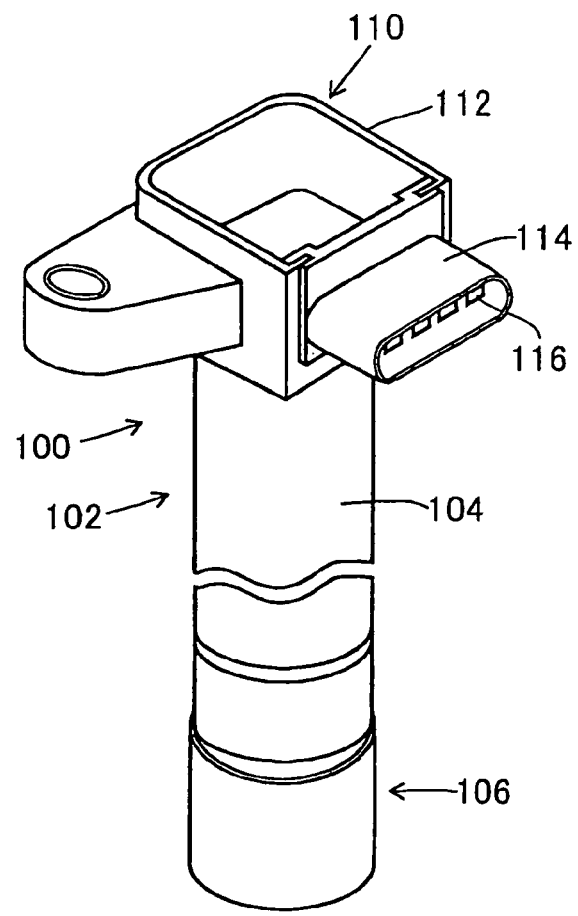
FIG. 1 is a schematic perspective view showing an ignition coil including semiconductor equipment according to a first embodiment of the present invention.

Semiconductor equipment according to a first embodiment of the present invention is shown in FIG. 1. The equipment is suitably used for an igniter for switching the primary current of the primary coil on and off. The igniter is mounted on an ignition coil of an automotive vehicle (i.e., a stick coil). As shown in FIG. 1, the stick coil 100 is composed of a coil portion 102, a tower portion 106 and a controller 110. The coil portion 102 is disposed in a middle of the coil 100 in a longitudinal direction. The tower portion 106 is disposed below the coil portion 102. The controller 110 is disposed above the coil portion 102. The coil portion 102 accommodates the primary coil and a secondary coil (not shown) inside a body casing 104. The controller 110 accommodates an igniter 10 for switching the primary current of the primary coil on and off. Specifically, the igniter 10 is disposed in an upper casing 112. An external terminal 116 is disposed on a connector 114.

Figure 2:
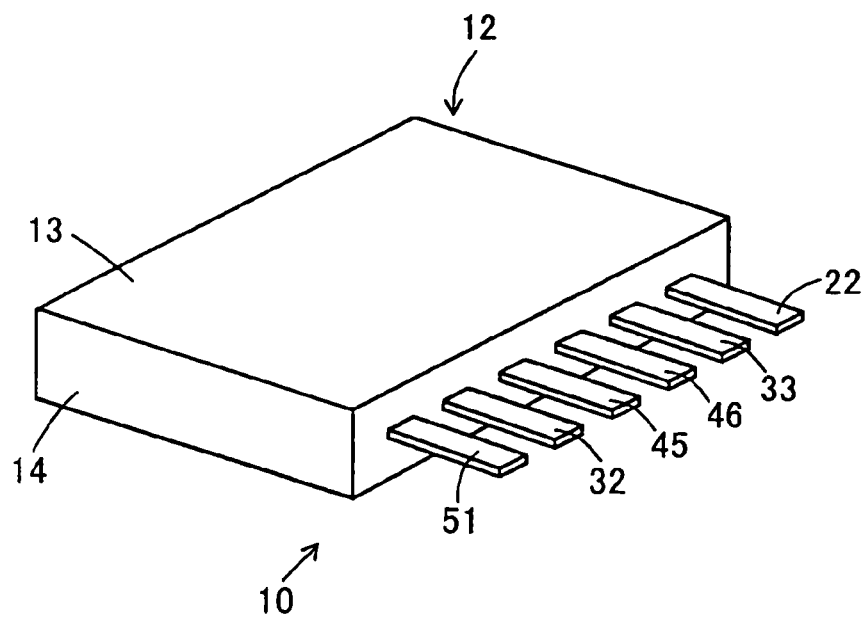
FIG. 2 is a perspective view showing the equipment according to the first embodiment.
Figure 3:
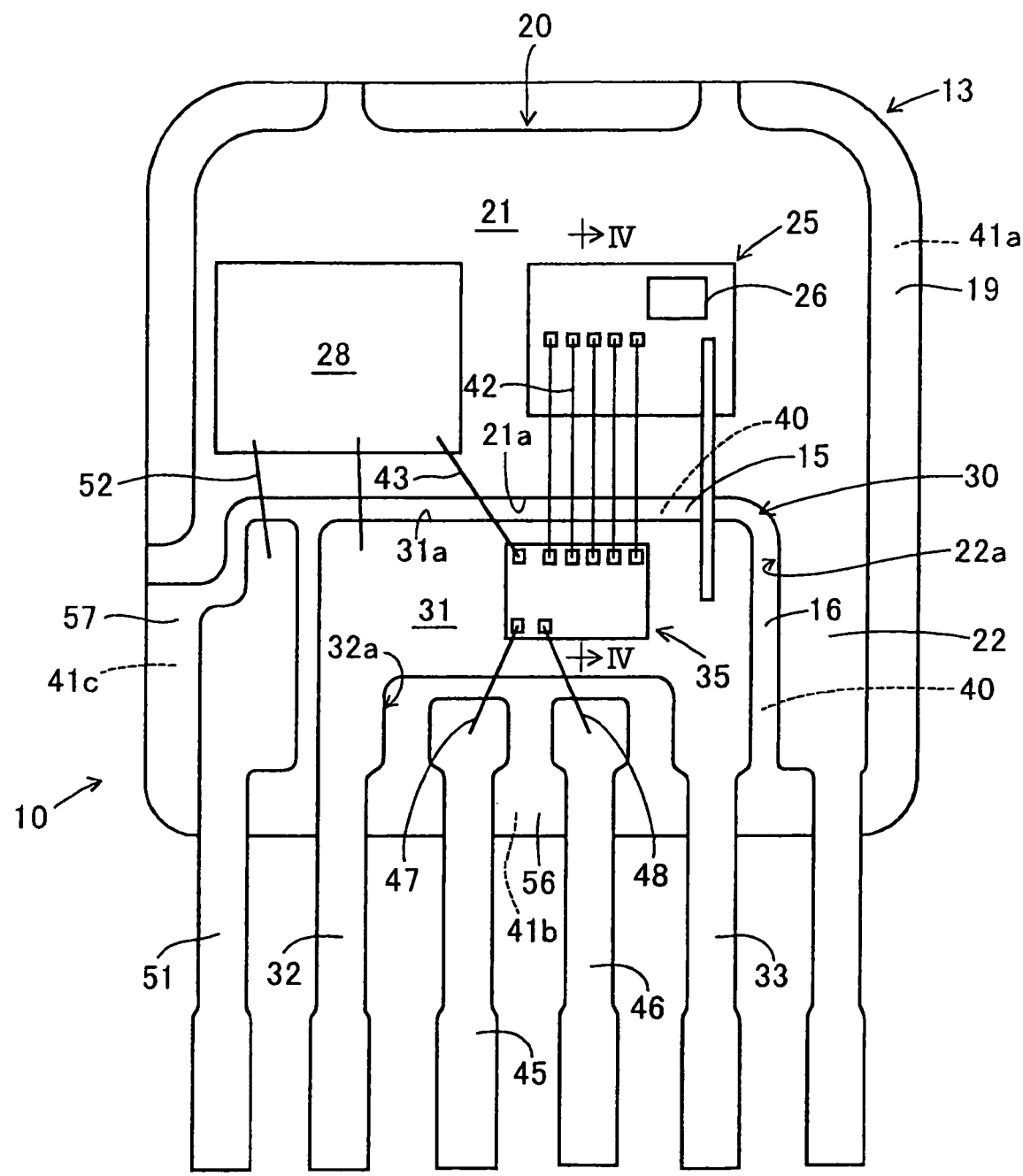
FIG. 3 is a plan view showing the equipment without an upper cover, according to the first embodiment.
Figure 4:
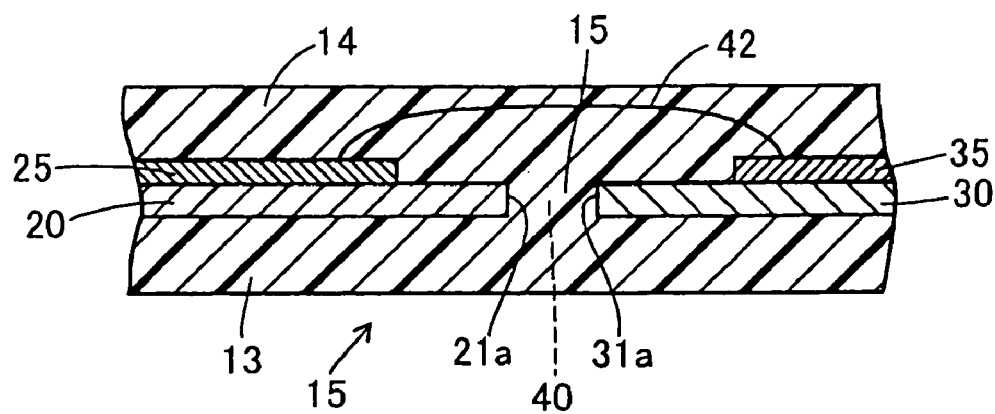
FIG. 4 is a partial cross sectional view showing the equipment taken along line IV—IV in FIG. 3.

The igniter 10 is shown in FIGS. 2 to 4. Here, in FIG. 3, an upper cover 14 disposed on an upper portion of the igniter 10 is not shown. The igniter 10 includes a resin mold 12, the first lead frame 20, an IGBT chip 25 as a power device, the second lead frame 30, an IC chip 35 as a control device, and lead frames 45, 46, 51. The resin mold 12 has a flat rectangular shape. The first lead frame 20 and the IGBT chip 25, and the second lead frame 30 and the IC chip 35 are molded with the resin mold 12, and are disposed inside of the resin mold 12 side by side. The resin mold 12 includes a lower cover 13, the upper cover 14, thermal resistors 15, 16, and a periphery resin portion 19. The lower cover 13 is disposed on a lower portion of the igniter 10. Specifically, the lower cover 13 is disposed below the first and the second lead frames 20, 30. The lower cover 13 covers lower portions of the lead frames 45, 46, 51. The upper cover 14 covers upper portions of the first lead frame 20 and the power device 25, the second lead frame 30 and the IC chip 35, and a bonding wire 42. The upper cover 14 has a rectangular shape. Further, the upper cover 14 covers a protection chip 28 and the upper portions of the lead frames 45, 46, 51.

The thermal resistors 15, 16 as clearance filling portions bridge a clearance 40 disposed between the first and the second lead frames 20, 30. Further, the thermal resistors 15, 16 connect between the lower cover 13 and the upper cover 14. The width of each thermal resistor 15, 16 is equal to or larger than 0.2 mm. The periphery resin portion 19 connects between the lower cover 13 and the upper cover 14 so that the periphery resin portion 19 fills another clearance 41a disposed outside of the first lead frame 20. Specifically, the clearance 41a is disposed outside of the outer periphery of the first lead frame 20. The first lead frame 20 includes a main part 21 having a rectangular shape and an extension part 22 extending from a corner of the main part 21. The main part 21 is covered with the lower cover 13 and the upper cover 14 of the resin mold 12. The extension part 22 protrudes from the resin mold 12 toward a side of the resin mold 12. The extension part 22 connects to the primary coil (not shown). The IGBT chip 25 is mounted on the main part 21. The IGBT chip 25 switches the primary current of the primary coil on and off. The IGBT chip 25 accommodates a temperature sensitive diode 26. The protection chip 28 formed of a resistor is mounted on the main part 21. The protection chip 28 is disposed near the IGBT chip 25. The protection chip 28 protects the IC chip 35.

The second lead frame 30 includes the second main part 31, and a pair of the second extension parts 32, 33. The second main part 31 of the second lead frame 30 is smaller than the first main part 21 of the first lead frame 20. The second main part 31 has a long and thin rectangular shape. The second extension parts 32, 33 extend toward the same direction as the first extension part 22 from a longitudinal side. The second main part 31 is disposed in a concavity 22a. The concavity 22a is formed by the first main part 20 and the first extension part of the first lead frame 20. The second main part 31 is covered with the lower cover 13 and the upper cover 14 of the resin mold 12. The second extension parts 32, 33 protrude from the resin mold 12 toward a side of the resin mold 12. Here, an outer periphery 21a of the first main part 21 of the first lead frame 20 is separated from an outer periphery 31a of the second main part 31 of the second lead frame 30 by a predetermined distance so that a clearance 40 is disposed between the first lead frame 20 and the second lead frame 30. The clearance 40 has an L-shape. The thermal resistors 15, 16 fill in the clearance 40.

The right side second extension part 33 in the second lead frame 30 is grounded. The left side second extension part 32 in the second lead frame 30 secures rigidity of the second main part 31 until the second main part 31 is molded with the resin mold 12. The IC chip 35 mounted on the main part 31 controls operation of the IGBT chip 25. The IC chip 35 connects to the IGBT chip 25 and the protection chip 28 through the bonding wires 42, 43.

The second concavity 32a is formed by the second main part 31 of the second lead frame 30 and a pair of the second extension parts 32, 33. The third lead frame 45 and the fourth lead frame 46 are disposed in the second concavity 32a in such a manner that the third lead frame 45 is separated from the fourth lead frame 46 by a predetermined distance. The third lead frame 45 outputs an igniter monitor signal. The fourth lead frame 46 inputs an igniter signal. The first and the second lead frames 45, 46 extend in the same direction as the second extension parts 32, 33. The first and the second lead frames 45, 46 connect to the IC chip 35 on the second lead frame 30 through bonding wires 47, 48, respectively. The igniter signal is inputted from external circuit through the fourth lead frame 46. The fifth lead frame 51 is aligned in parallel to the second extension part 32. The fifth lead frame 51 works for a power source. The fifth lead frame 51 is separated from the second extension part 32 by a predetermined distance. The fifth lead frame 51 extends in the same direction as the second extension part 32. The fifth lead frame 51 connects to the protection chip 28 on the first lead frame 20 through a bonding wire 52.

A clearance 41b is formed between the second extension parts 32, 33 of the second lead frame 30 and the third and the fourth lead frames 45, 46. A part 56 of the resin mold 12 fills in the clearance 41b. Another clearance 41c is formed between the first and the second lead frames 20, 30 and the fifth lead frame 51. Another part 57 of the resin mold 12 fills in the clearance 41c.

Figure 5:
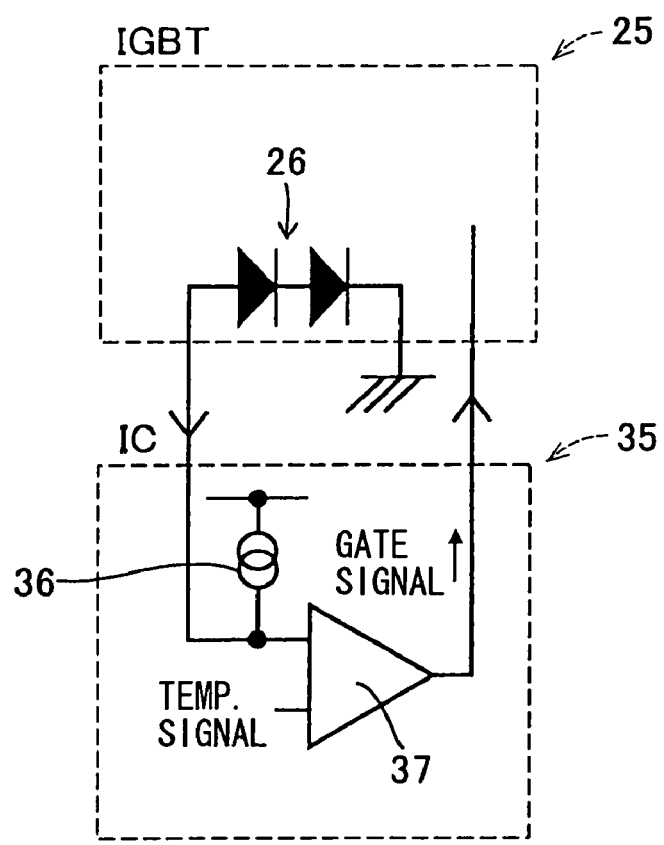
FIG. 5 is a circuit diagram showing a main part of the equipment according to the first embodiment.

As shown in FIG. 5, the temperature sensitive diode 26 is accommodated in the IGBT chip 25 disposed on the first lead frame 20. The temperature sensitive diode 26 is composed of two diodes, which are connected in series. A power source 36 for generating constant current and a comparator 37 are disposed in the IC chip 35 on the second lead frame 30. The temperature sensitive diode 26 detects the temperature of the IGBT chip 25, and outputs a voltage corresponding to the temperature to the comparator 37. The comparator 37 compares the voltage and a predetermined reference voltage. Then, the comparator 37 outputs a comparison result to a gate of the IGBT chip 25.

Figure 6:
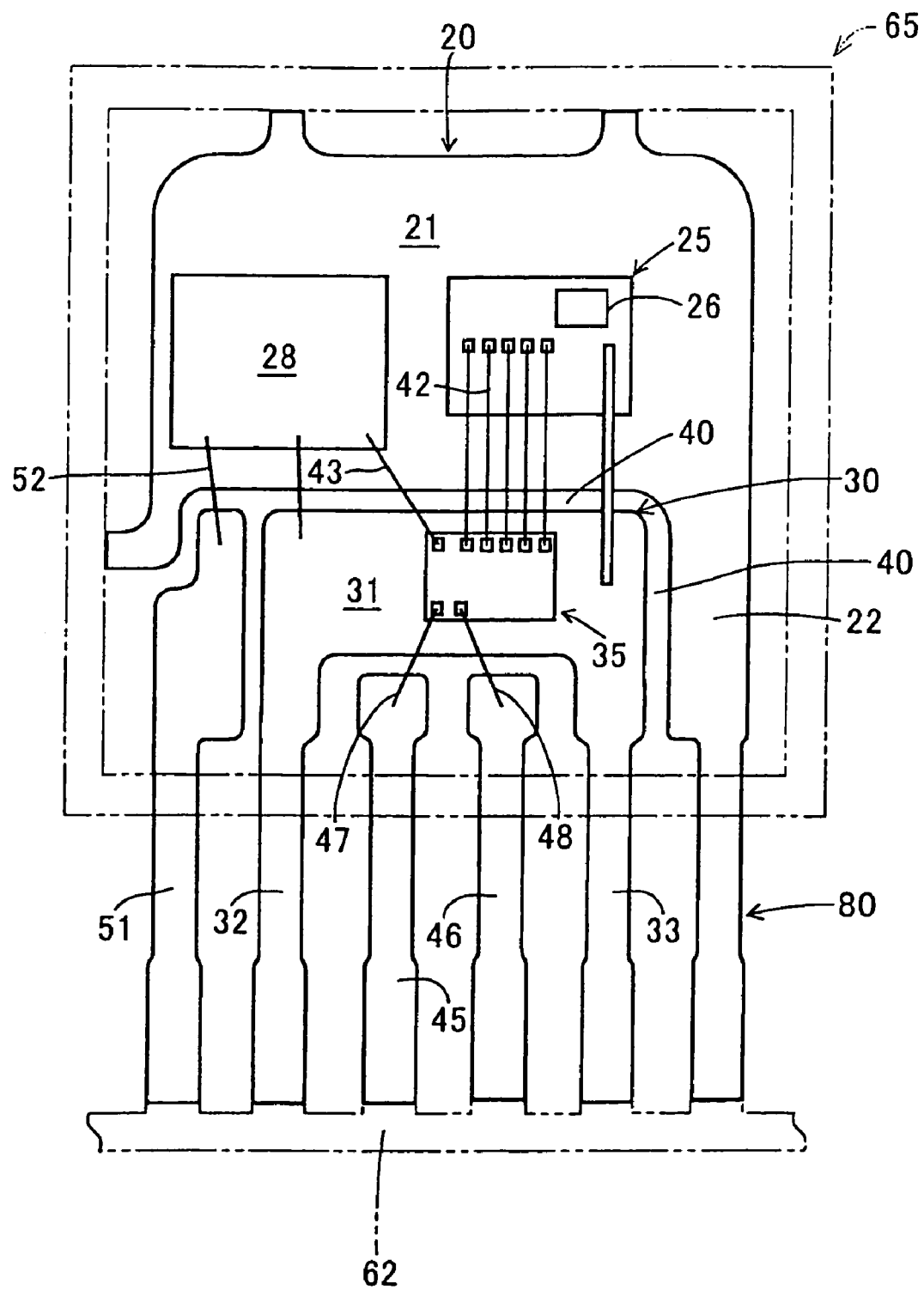
FIG. 6 is a plan view explaining a method for manufacturing the equipment according to the first embodiment.

Next, packaging of the first lead frame 20 and the IGBT chip 25, and the second lead frame 30 and the IC chip 35 with the resin mold 12 is explained with reference to FIG. 6. The resin mold 12 is formed by a method including a potting method and an injection molding method. Firstly, the first extension part 22 of the first lead frame 20, the second extension part 32 of the second lead frame 30, the third, the fourth and the fifth lead frames 45, 46, 51 are connected each other with a connection portion 62. The connection portion 62 is shown as a chain double-dashed line in FIG. 6. The IGBT chip 25 and the protection chip 28 are mounted on the first lead frame 20. The IC chip 35 is mounted on the second lead frame 30. These parts are integrated into an assembly 80 as one body construction.

Then, the first lead frame 20, the second lead frame 30 and the like are set in a mold 65 freely. After that, epoxy resin is injected into or potted into the mold 65 as a package casing. Thus, the epoxy resin penetrates in the clearance 40 between the lead frames 20, 30. Further, the epoxy resin penetrates above the upper side of the IGBT chip 25 and the IC chip 35 and below the lower side of the first and the second lead frames 20, 30. Thus, the epoxy resin is hardened so that the lower cover 13, the upper-cover 14, the thermal resistors 15, 16, and the outer periphery resin portion 19 are formed. Then, the connection portion 62 is removed from the extension portions 22, 32 of the first and the second lead frames 20, 30.

Thus, the igniter 10 is accommodated and positioned in the upper casing 112 of the controller 110 in the stick coil 100. The first extension part 22 of the first lead frame 20 connects to the primary coil, and the second extension part 33 of the second lead frame 30 and the lead frames 45, 46, 51 are connected to the external terminal 116 through a bonding wire (not shown). When the epoxy resin is filled in the upper casing 112, the epoxy resin as an insulation resin is filled around the igniter 10.

Operation of the igniter 10 is described in FIGS. 7A to 7D. FIG. 7A shows the ignition signal IIVA inputted into the IGBT chip 25, FIG. 7B shows a temperature signal VIIB of the temperature sensitive diode 26, FIG. 7C shows a decision signal VIIC of the comparator 37, and FIG. 7D shows a gate signal VIID of the IGBT chip 25. The ignition signal VIIA is inputted into the IGBT chip 25 from the fourth lead frame 46 through the IC chip 35. In general, the ignition signal VIIA is shown as a dotted line in FIG. 7A, so that the ignition signal VIIA repeats on and off. Specifically, the ignition signal turns on for a short time, and then, the ignition signal turns off. Thus, on-off cycle of the ignition signal is repeated. However, when some abnormity is occurred in the device so that the interval of turn-on of the ignition signal becomes longer shown as a solid line in FIG. 7A, the igniter generates heat for a long time. Specifically, the ignition signal VIIA2 has a long turn-on time. Thus, the temperature signal VIIB of the temperature sensitive diode 26 is reduced as shown as VIIB1 in FIG. 7B.

The temperature signal VIIB has the minimum temperature threshold voltage, which corresponds a predetermined temperature, e.g., 150° C. When the temperature signal VIIB reaches the minimum temperature threshold voltage, for example, when the temperature of the IGBT chip 25 reaches 150° C., the decision signal VIIC turns on, shown as VIIC1 in FIG. 7C. Specifically, the comparator 37 determines that the temperature of the IGBT chip 25 becomes abnormal high temperature. On the basis of the decision signal VIIC1 from the comparator 37, the gate signal VIID turns off shown as VIID1 in FIG. 7D. Specifically, the gate signal VIID from the IC chip 35 to the IGBT chip 25 is shut down. Thus, the temperature of the IGBT chip is not increased any more. Thus, the IGBT chip 25 is prevented from increasing its temperature.

Further, when the ignition signal VIIA turns off shown as VIIA3 in FIG. 7A, the decision signal VIIC turns off shown as VIIC2 in FIG. 7C. Then, when the ignition signal VIIA turns on shown as VIIA4 in FIG. 7A, the gate signal VIID turns on shown as VIID2 in FIG. 7D.

In the above igniter 10, although the temperature of the IGBT chip 25 becomes higher when the IGBT chip operates, this heat is prevented from conducting to the IC chip 35 through the first and the second lead frames 20, 30. Specifically, the outer periphery 21a of the first main part 21 is separated from the outer periphery 31a of the second main part 31. Further, the thermal resistors 15, 16 are inserted into the clearance 40 between the outer periphery 21a of the first main part 21 and the outer periphery 31a of the second main part 31. The thermal resistors 15, 16 have low coefficient of thermal conductivity lower than that of the lead frames 20, 30. Thus, the thermal resistors 15, 16 suppress to conduct heat from the first lead frame 20 to the second lead frame 30. Here, the first lead frame 20 has high temperature, and the second lead frame 30 has low temperature.

In the above igniter 10, accuracy of the temperature control of the IC chip 35 is comparatively high. This is because the heat is limited from conducting from the first lead frame 20 to the second lead frame 30. Thus, the IC chip 35 can be set to comply with required functions. Specifically, circuit constant and the like in the IC chip 35 can be determined without considering temperature increase of the IC chip 35.

In the above igniter 10, the IGBT chip 25 accommodates the temperature sensitive diode 26. Thus, the IGBT chip 25 is protected from damaging with temperature increase. Specifically, the temperature sensitive diode 26 detects abnormal high temperature of the IGBT chip 25, so that the diode 26 outputs the abnormal high temperature signal to the IC chip 35. Then, the comparator 37 of the IC chip 35 compares the temperature signal with the reference voltage. When the temperature signal is higher than the reference voltage, the IC chip 25 outputs a shut down signal to the IGBT chip 25. On the basis of the shut down signal, the gate signal of the IGBT chip 25 turns off. Thus, the temperature of the IGBT chip 25 is not increased. Accordingly, operation failure of the igniter 10 is prevented.

The igniter 10 is easily packaged. Specifically, the assembly 80 including the first lead frame 20 with the IGBT chip 25 and the second lead frame 30 with the IC chip 35 is mounted in the mold 65. Then, the epoxy resin is potted into space between the mold 65 and the assembly 80.

Second Embodiment

Figure 8A:
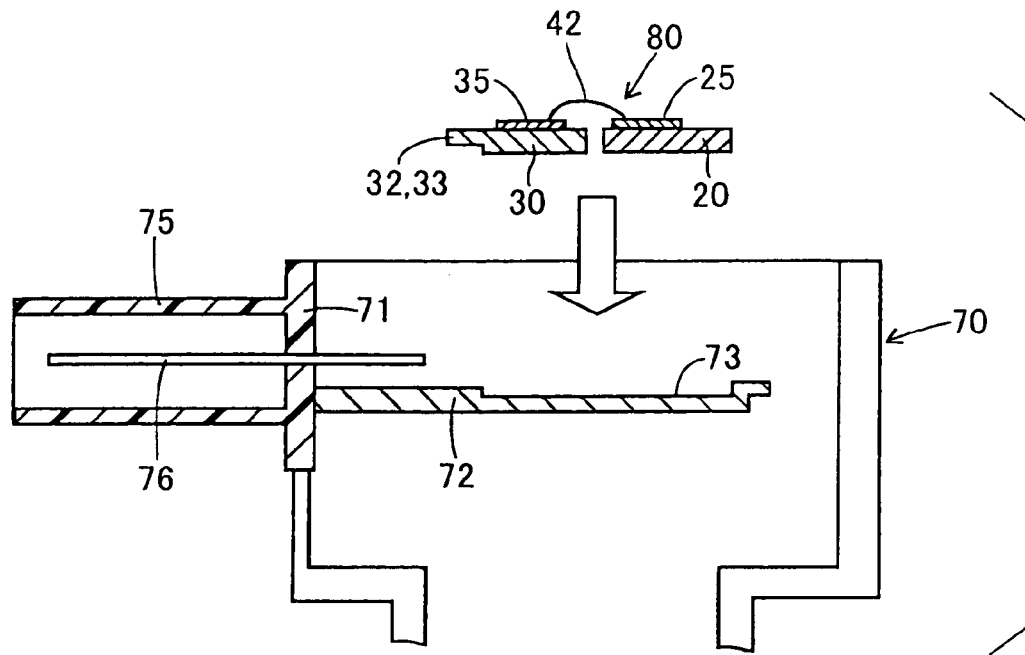
FIGS. 8A and 8B are partial cross sectional views explaining a method for manufacturing semiconductor equipment according to a second embodiment of the present invention.
Figure 8B:
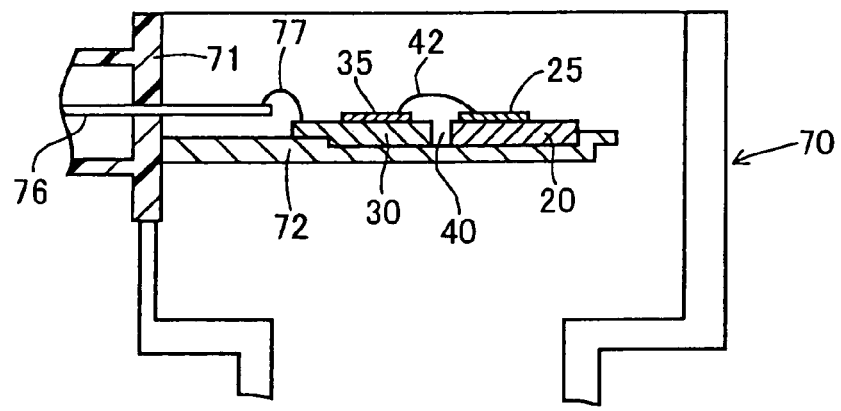

FIGS. 8A and 8B show a method for manufacturing semiconductor equipment according to a second embodiment of the present invention. The assembly 80 is accommodated in an upper casing 70. Specifically, the assembly 80 is positioned in the upper casing 70 before the assembly 80 is not molded with resin. Then, epoxy resin is inserted into the upper casing 70 so that the epoxy resin covers the casing 70. Specifically, as shown in FIG. 8A, the assembly 80 is mounted in a concavity 73 of a base 72, which protrudes from a sidewall 71 of the upper casing 70. The base 72 protrudes inside of the casing 70. Then, the first extension part 22 of the first lead frame 20, the second extension part 33 of the second lead frame 30, and the third, the fourth and the fifth lead frames 45, 46, 51 are connected to a terminal 76 of a connector 75 through a bonding wire 77.

After that, the first extension part 22, the second extension part 33 and the like are removed from the connection portion 62. Then, the epoxy resin is poured into the upper casing 70. Thus, the epoxy resin is gradually filled from the lower portion of the casing 70 to the upper portion of the casing 70. When the epoxy resin is filled up to the base 72, the upper side of the assembly 80 such as the upper side of the first lead frame 20, the upper side of the IGBT chip 25, the upper side of the second lead frame 30, and the upper side of the IC chip 35 are covered with the epoxy resin. Further, the clearance 40 disposed between the first lead frame 20 and the second lead frame 30 is filled with the epoxy resin. Thus, the thermal resistors 15, 16 are formed. Here, the epoxy resin does not penetrate between the base 72 and the first and the second lead frames 20, 30.

In this method, when the epoxy resin is poured into the casing 70, the epoxy resin covers the assembly 80. Further, the epoxy resin fills the clearance 40. Accordingly, filling of the epoxy resin into the casing 70 and forming the thermal resistors 15, 16 disposed between the first and the second lead frames 20, 30 are performed simultaneously. Thus, manufacturing process is simplified.

Figure 9:
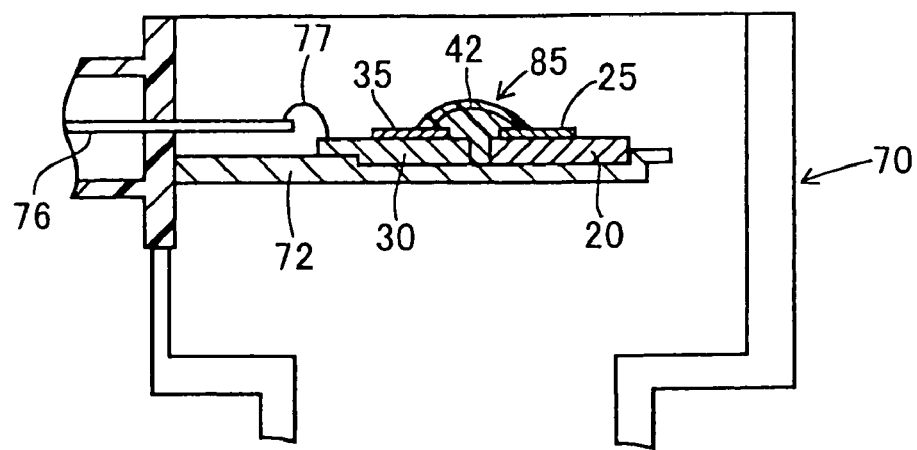
FIG. 9 is a partial cross sectional view explaining a method for manufacturing semiconductor equipment according to a modification of the second embodiment.
Figure 10:
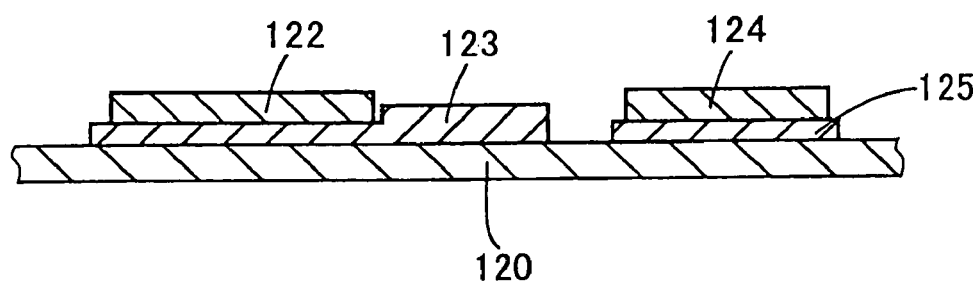
FIG. 10 is a cross sectional view showing semiconductor equipment according to a prior art.

FIG. 9 shows a method for manufacturing semiconductor equipment according to a modification of the second embodiment. The bonding wire 42 for connecting between the IGBT chip 25 and the IC chip 35 is covered with poly-amide resin or adhesive 85 before the epoxy resin is poured into the upper casing 70. In this case, the bonding wires 43, 47, 48, 52 are also covered with the poly-amide resin or the adhesive 85. Further, the clearance 40 disposed between the first lead frame 20 and the second lead frame 30 can be filled with the poly-amide resin or the adhesive 85. Further, the clearance 40 can be filled with the epoxy resin. In this case, since the bonding wire 42 and the like are covered with the poly-amide resin or the adhesive 85, the bonding wire 42 and the like are easily bonded to the epoxy resin. Thus, no bubble is generated between the epoxy resin and the poly-amide resin or the adhesive 85.

Modifications

Semiconductor equipment described in the above embodiments includes the first lead frame with the first semiconductor device, the second lead frame with the second semiconductor device, the thermal resistor, and the temperature sensitive device. The semiconductor equipment is suitably used for the igniter of the ignition coil. However, the semiconductor equipment can be used for other devices. Further, the thermal resistor is preferably formed from a part of resin mold when the first and the second lead frames are packaged.

The first and the second lead frames are made of, for example, copper plate. The thickness of the first lead frame can be the same as the second lead frame. Further, the thickness of the first lead frame can be different from that of the second lead frame. The first and the second lead frames are separated each other. Thus, the first lead frame is separated from the second lead frame by a predetermined distance in a horizontal direction or in a vertical direction. The horizontal direction is perpendicular to the vertical direction. The vertical direction is a thickness direction of the lead frame. The shapes of the first and the second lead frames are not limited. It is preferred that one of the first and the second lead frames is disposed in a concavity of the other one of the first and the second lead frames. In this case, the dimensions of the equipment can be reduced.

When the first lead frame is separated from the second lead frame by a predetermined distance in the horizontal direction, a clearance is formed between the outer periphery of first lead frame and the outer periphery of the second lead frame. In this case, the shape of the clearance can be a linear shape or a curved shape. Further, the width of the clearance can be constant or variable. The shape and the width of the clearance are determined by the outline of the lead frames. Further, the depth of the clearance is determined by the thickness of the lead frames. It is preferred that the width of the clearance is equal to or larger than 0.2 mm. When the width of the clearance is equal to or larger than 0.2 mm, resin easily penetrates into the clearance so that the thermal resistors are securely formed between the lead frames. Further, when the width of the clearance is equal to or larger than 0.2 mm, withstand voltage between the lead frames regarding electric potential difference therebetween becomes sufficiently large.

When the first lead frame is separated from the second lead frame by a predetermined distance in a vertical direction, a clearance is formed between the first semiconductor device disposed on the bottom or the top of the first lead frame and the second semiconductor device disposed on the top of the second lead frame or the bottom of the second lead frame. The clearance, i.e., the height difference is preferably equal to or larger than 0.2 mm. Each of the first and the second lead frames has one or multiple extension parts, which provide terminals and is disposed on the outer periphery of the lead frame. The first semiconductor device is connected to the second semiconductor device through a bonding wire.

The first semiconductor device such as an IGBT chip having comparatively high operational temperature is mounted on the first lead frame. The second semiconductor device such as an IC chip having comparatively low operational temperature is mounted on the second lead frame. The first semiconductor device as a power device, for example, drives an actuator such as a primary coil of an ignition coil by using a switching operation. The first semiconductor device includes, for example, the IGBT and a FET. The second semiconductor device as a control chip, for example, controls the power device on the basis of a signal inputted from an external circuit. The second semiconductor device includes the IC chip.

The IGBT chip can have the temperature sensitive device such as a temperature sensitive diode. The temperature sensitive device detects the operational temperature of the power device. The temperature sensitive device is formed on an insulation film of the IGBT chip. When the operational temperature of the IGBT chip increases, the output voltage of the temperature sensitive diode is reduced. In this case, the output voltage of the diode is a forward voltage. In this case, the diode outputs a signal corresponding to the forward voltage to the control device. The control device compares the temperature of the power device and the reference temperature. When the temperature of the power device is higher than the reference temperature, the power device is shut down so that the power device is protected from damage. Accordingly, malfunction of the actuator is prevented.

The first semiconductor device mounted on the first lead frame and the second semiconductor device mounted on the second lead frame are packaged by a resin mold (i.e., a package resin mold) for insulation and for thermal insulation. When the first lead frame is separated from the second lead frame in the horizontal direction, the resin mold includes the lower and the upper covers and the thermal resistors. The lower and the upper covers are disposed on the lower side and the upper side of the first and the second lead frames. The thermal resistors are disposed in the clearance between the outer periphery of the first lead frame and the outer periphery of the second lead frame. The resin mold is made of material having low thermal conductivity such as epoxy resin or urethane resin. The thermal conductivity of the resin mold is smaller than that of the first and the second lead frames. Thus, the thermal resistor works for preventing heat transfer from the first lead frame to the second lead frame.

When the semiconductor equipment is the igniter, the first manufacturing method for packaging with the resin mold is such that the first and the second lead frames are positioned in a package mold freely. Then, the epoxy resin is potted, i.e., poured between the lead frames and the mold. Then, the epoxy resin is hardened. Thus, the upper cover covers the bottoms of the first and the second lead frames, and the upper cover covers the tope of the first lead frame with the first semiconductor device and the second lead frame with the second semiconductor device. Further, resin filling material to be the thermal resistor fills in the clearance between the first and the second lead frames. The igniter is formed. Then, the igniter is accommodated in the upper casing. Therefore, the igniter and the upper casing are manufactured independently.

When the semiconductor equipment is the igniter, the second manufacturing method for packaging with the resin mold is such that the first and the second lead frames are positioned in the upper casing of the ignition coil by using the base for mounting the lead frames. The first semiconductor device is mounted on the first lead frame, and the second semiconductor device is mounted on the second lead frame. Then, the epoxy resin is potted in the upper casing, and then, the epoxy resin is hardened. Thus, the upper cover covers the tops of the first lead frame with the first semiconductor device and the second lead frame with the second semiconductor device. The resin filling material to be the thermal resistor fills the clearance between the first and the second lead frames. Thus, the igniter is manufactured together with the upper casing of the ignition coil.

In the above methods, when the igniter is packaged by the resin mold, the bonding wire for connecting between the first and the second semiconductor devices is covered with the epoxy resin and the like. Here, the linear coefficient of thermal conductivity of the epoxy resin is different from that of the bonding wire. Therefore, the epoxy resin may not be bonded to the bonding wire sufficiently. In view of this, it is preferred that the bonding wire is coated with poly-amide resin or adhesive before the igniter is packaged.

Such changes and modifications are to be understood as being within the scope of the present invention as defined by the appended claims.

What is claimed is:

1. Semiconductor equipment comprising:
   a first lead frame having a first semiconductor device, which has a high operational temperature;
   a second lead flame having a second semiconductor device, which has a low operational temperature lower than the operational temperature of the first semiconductor device;
   a thermal resistor for preventing heat transfer from the first lead frame to the second lead frame;and
   a temperature sensitive device for detecting the operational temperature of the first semiconductor device and for outputting a temperature signal to the second semiconductor device,
   the first lead frame being separated from the second lead frame by a predetermined distance,
   the thermal resistor being disposed in a clearance between the first lead frame and the second lead frame,
   the second semiconductor device restricting operaton of the first semiconductor device in a case where the operational temperature of the first semiconductor device is higher than a predetermined temperature;
   the first lead frame and the second lead frame being aligned in a horizontal direction,
   the thermal resistor being disposed between an outer periphery of the first lead frame and an outer periphery of the second lead frame;
   the first lead frame with the first semiconductor device and the second lead frame with the second semiconductor device being molded with a resin mold, which has thermal conductivity lower than that of the first or the second lead frame, and
   the thermal resistor being provided by a part of the resin mold, which is filled in the clearance between the first and the second lead frames; and
   wherein the semiconductor equipment is an igniter of an ignition coil,
   the first semiconductor device is a power device for switching primary current of the ignition coil on and off, and
   the second semiconductor device is a control device for controlling the power device.

2. The equipment according to claim 1, where the resin mold includes a lower cover, an upper cover and a resin filling portion,
   the lower cover covers a lower side of the first and the second lead frames,
   the upper cover covers an upper side of the first and the second semiconductor devices, and
   the resin filling portion provides the thermal resistor.

3. The equipment according to claim 1, wherein the resin mold includes an upper cover and a resin filling portion,
   the upper cover covers an upper side of the first and the second semiconductor devices, and
   the resin filling portion provides the thermal resistor.

4. The equipment according to claim 2, wherein
   the first semiconductor device is connected to the second semiconductor device through a bonding wire, and
   the bonding wire is covered with resin or adhesive.

5. The equipment according to claim 1, wherein the temperature sensitive device is accommodated in the power device, and
   the second semiconductor device includes a comparator for comparing the operational temperature of the power device and a reference temperature.

* * * * *